US006642742B1

(12) United States Patent
Loyer

(10) Patent No.: US 6,642,742 B1
(45) Date of Patent: Nov. 4, 2003

(54) METHOD AND APPARATUS FOR CONTROLLING OUTPUT IMPEDANCE

(75) Inventor: Bruce A. Loyer, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/103,266

(22) Filed: Mar. 21, 2002

(51) Int. Cl.[7] .............................................. H03K 17/16
(52) U.S. Cl. .............................. 326/30; 326/83; 326/87
(58) Field of Search .............................. 326/83, 86, 87, 326/30

(56) References Cited

U.S. PATENT DOCUMENTS

| | | |
|---|---|---|
| 5,134,311 A | 7/1992 | Biber et al. |
| 5,298,800 A | 3/1994 | Dunlop et al. |
| 5,313,118 A | 5/1994 | Lundberg |
| 5,457,407 A | 10/1995 | Shu et al. |
| 5,739,707 A * | 4/1998 | Barraclough ................ 327/112 |
| 5,760,601 A | 6/1998 | Frankeny |
| 5,898,321 A * | 4/1999 | Ilkbahar et al. ............... 326/87 |
| 6,087,847 A * | 7/2000 | Mooney et al. ............... 326/30 |
| 6,127,862 A * | 10/2000 | Kawasumi ................... 327/112 |
| 6,157,215 A | 12/2000 | Gabara et al. |
| 6,194,924 B1 | 2/2001 | Welch et al. |
| 6,225,819 B1 | 5/2001 | Rees et al. |
| 2002/0093363 A1 * | 7/2002 | Wey et ......................... 326/87 |

* cited by examiner

Primary Examiner—Don Le
(74) Attorney, Agent, or Firm—Meyertons Hood Kivlin Kowert & Goetzel, P.C.; B. Noël Kivlin

(57) ABSTRACT

A method and apparatus for controlling output impedance of an input/output (I/O) circuit. In one embodiment, an I/O circuit includes a first plurality of resistive elements connected in parallel and a second plurality of resistive elements connected in parallel. Each of the resistive elements includes a control terminal. The control terminal may be used to activate or deactivate the resistive element. The control terminal for each resistive element may be controlled by a control circuit, which may be configured to activate one or more of the resistive elements. Each of the resistive elements of the first plurality may be of substantially different resistances, as may be true with the second plurality of resistive elements. Due to the substantially different resistances of each of the first and second pluralities of resistive elements, the resistive step sizes for the I/O circuit remain substantially equal as additional resistive elements are activated.

42 Claims, 4 Drawing Sheets

| Transistor # | Transistor Impedance (Ohms) | Total Parallel Impedance (Ohms) |
|---|---|---|
| 0 | 92 | 92 |
| 1 | 1722 | 87 |
| 2 | 1547 | 83 |
| 3 | 1382 | 78 |
| 4 | 1226 | 73 |
| 5 | 1079 | 69 |
| 6 | 942 | 64 |
| 7 | 814 | 59 |
| 8 | 695 | 55 |
| 9 | 586 | 50 |
| 10 | 486 | 45 |
| 11 | 395 | 41 |
| 12 | 314 | 36 |
| 13 | 242 | 31 |
| 14 | 179 | 27 |
| 15 | 126 | 22 |

METHOD AND APPARATUS FOR CONTROLLING OUTPUT IMPEDANCE

BACKGROUND OF THE INVENTION

1. Field of the Invention

This invention relates to electronic circuits, and more particularly, to controlling the output impedance of a driver circuit.

2. Description of the Related Art

Controlling the output impedance of drivers in an integrated circuit is of critical importance. Integrated circuits must often times drive signals onto signal lines of varying lengths and impedances. Matching the driver output impedance to that of the signal line may be necessary in order to prevent various effects from occurring. For example, signal reflections due to mismatched impedances may cause a receiving circuit to read an incorrect logic value. These problems can become more acute in high-speed interfaces, thus making impedance matching all the more critical in the design of newer generations of greater operating speeds.

It is most often desirable to control the output impedance of an integrated circuit driver within the chip itself. Controlling the impedance with resistors external to the chip may be impractical if not impossible. Thus, typical driver circuits often include some sort of impedance matching mechanism within the chip. Often times, transistors are used as the impedance matching mechanism. Typically, a plurality of transistors are used (as opposed to a single transistor) due to process, voltage, and temperature variations. The transistors may be connected in parallel between pairs of their respective terminals (e.g. the source and drain terminals of field effect transistors). The resistance, or impedance, on an output node may be controlled by activating one or more of the transistors. The transistors may be of substantially equal impedances, and therefore the impedance step sizes may vary as more transistors are activated.

SUMMARY OF THE INVENTION

A method and apparatus for controlling output impedance of an input/output (I/O) circuit is disclosed. In one embodiment, an I/O circuit may include a first plurality of resistive elements connected in parallel between a first reference node and an output node and a second plurality of resistive elements connected in parallel between the output node and a second reference node. Each of the resistive elements may include a control terminal. The control terminal may be used to activate or deactivate the resistive element. The control terminal for each resistive element may be controlled by a control circuit, which may be configured to activate one or more of the resistive elements. Each of the resistive elements of the first plurality may be of substantially different resistances, as may be true with the second plurality of resistive elements. Due to the substantially different resistances of each of the resistive elements of the first and second pluralities, the resistive step sizes for the I/O circuit may remain substantially equal as additional resistive elements are activated.

In one embodiment, the resistive elements may be field effect transistors. A gate terminal may be used as the control terminal, and may be coupled to the control circuit. For the first plurality of transistors, the drain and source terminals of each may be coupled between a voltage node and an output node. For the second plurality of transistors, the drain and source terminals may be coupled between the output node and a reference node (e.g. a ground node). When the I/O circuit is performing a transmission at a logic high voltage, the control circuit may activate one or more of the first plurality of transistors in order to achieve the desired output impedance. When performing a transmission at a logic low level, the control circuit may activate one or more of the second plurality of transistors. The activation of one or more transistors of either the first plurality or second plurality may terminate the output node of the I/O circuit such that the output impedance substantially matches the impedance of a signal line to which it is connected. Matching the impedances of the output node and the signal line may allow for a maximum amount of signal strength to be transmitted while minimizing the amount of signal reflection that may otherwise occur on the-signal line.

In one embodiment, the transistors of each plurality may be of substantially different physical sizes, and consequently, may provide different amounts of resistance when activated. This may result in resistance step sizes being substantially equal as additional transistors are activated. For example, a first transistor may provide a nominal resistance (impedance) of 92 ohms. A second transistor may provide a nominal impedance of 1722 ohms. However, the parallel combination of these two transistors may produce a total resistance of 87 ohms. A third transistor may have a nominal resistance of 1547 ohms; the parallel combination of the first, second and third transistors may yield a resistance of 83 ohms. Thus, the step size resulting from the activating of successive transistors is, in this embodiment, between 4 and 5 ohms, and may be achieved by using transistors of different physical sizes.

BRIEF DESCRIPTION OF THE DRAWINGS

Other aspects of the invention will become apparent upon reading the following detailed description and upon reference to the accompanying drawings in which:

FIG. 3 is a table illustrating the effects of step size for activating successive transistors of varying physical size in order to obtain a desired output impedance.

Figure 1:
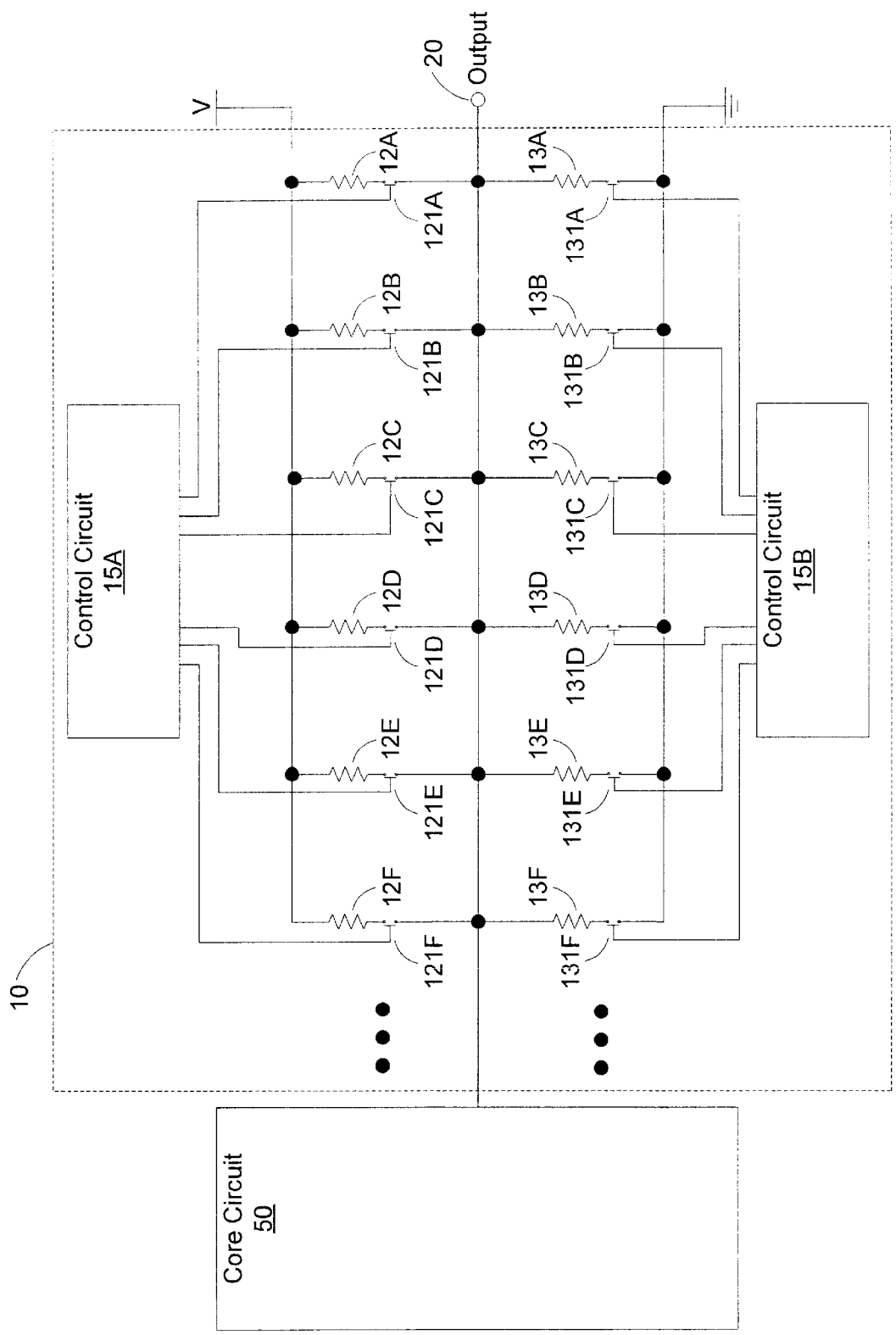
FIG. 1 is a schematic diagram of one embodiment of an I/O circuit including a first and second plurality of resistive elements for impedance matching with a signal line.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

Turning now to FIG. 1, a schematic diagram of one embodiment of an input/output (I/O) circuit including a first and second plurality of resistive elements for impedance matching with a signal line is shown. I/O circuit 10 may be coupled to core circuit 50 and may have an output node 20. Core circuit 50 may be a microprocessor core, chipset logic, or virtually any other type of chip. Output node 20 may be connected to a output pin of a package in which I/O circuit 10 and core circuit 50 may be contained. Core circuit 50 may drive signals onto a signal line that may be coupled to the output pin coupled to output node 20.

I/O circuit 10 may include a first plurality of resistive elements 12 and a second plurality of resistive elements 13. The resistive elements of both the first and second pluralities may include any type of resistive elements, such as resistors, transistors, and other type of circuitry which may resist or impede current flow. The first plurality of resistive elements includes resistive elements 12A through 12F, while the second plurality of resistive elements includes resistive elements 13A through 13F. A greater or lesser number of resistive elements may be present in other embodiments. Each resistive element 12 may be associated with a switch 121. Similarly, each resistive element 13 may be associated with a switch 131. Each of the switches may be used to activate its associated resistive element by closing the circuit between. the output node and its respective reference node. In the embodiment shown, the first reference node may be a voltage node while the second reference node may be a ground node. However, other embodiments are possible and contemplated wherein the first and second reference nodes may be of varying voltages (e.g. +5 and −5 volts, respectively).

Activating one or more of resistive elements 12 or 13 may result in the termination of a signal line coupled to output node 20. That is, activation of an appropriate number of resistive elements may result in the output impedance of I/O circuit 10 being substantially matched to the signal line to which output node is coupled. This may significantly reduce or eliminate signal reflections that may interfere with the operation of the circuits involved in the transmission (including the circuit receiving the transmission). Reflections on a signal line may in some cases cause an incorrect logic value to be read by a receiving circuit or other erroneous operation.

The amount of resistance provided by each of resistive elements 12 may be substantially different with respect to the other resistive elements 12. For example, resistive element 12A may provide a resistance that is substantially different from any of resistive elements 12B–12F; resistive element 12B may provide a resistance that is different from resistive elements 12A and 12C–12F, and so on. This may also be true for each of the plurality of resistive elements 13. Providing a different amount of resistance for each of the resistive elements 12/13 in I/O circuit 10 may allow for equal step sizes as additional resistive elements are activated (e.g. the amount of resistance may decrease by approximately 5 ohms for each additional resistive element activated). This will be discussed in further detail below.

Each of the first and second plurality of resistive elements 12/13 may be activated by a control circuit 15. Control circuit 15 is shown in this embodiment as two separate entities, control circuit 15A and control circuit 15B, for the sake of clarity. However, control circuit 15 may be implemented as a single entity in various embodiments. Each of control circuits 15A and 15B may activate one or more resistive elements, for the purposes of impedance matching, during a signal transmission. Control circuit ISA may be configured to activate one or more of resistive elements 12A–12F by closing one or more of switches 121A–121F. Similarly, control circuit 15B may be configured to activate one or more of resistive elements 13A–13F by closing one or more of switches 131A–131F.

Both control circuits 15A and 15B may be configured to determine the exact number of resistive elements to be activated during a signal transmission. In one embodiment, control circuits 15A and 15B may periodically perform a calibration routine. The calibration routine may determine the impedance of the signal line upon which a signal is to be transmitted. By determining the signal line impedance, each control circuit may then make a determination as to the number of resistive elements to be activated during a signal transmission in order for output circuit 10 to approximate the impedance of a signal line coupled to output node 20. The calibration routines will be discussed in further detail below.

Output circuit 10 may be configured for both logic high (e.g. 1.6 volts) and logic low (e.g. 0 volts) signal transmissions. During a logic high transmission, control circuit 15A may activate one or more of resistive elements 12A–12F in order to provide the desired impedance. Similarly, during a logic low transmission, control circuit 15B may activate one or more of resistive elements 13A–13F in order to provide the desired impedance. Typically, only resistive elements from the first plurality (12A–12F) or the second plurality (13A–13F) are activated during a signal transmission, depending on the logic level of the signal. However, during a transition between a logic high transmission to a logic low transmission (i.e. high-to-low or low-to-high), resistive elements from both pluralities may be momentarily activated. For example, if I/O circuit 10 is transitioning between the performance of a logic high transmission and a logic low transmission, one or more of resistive elements 13A–13F may be activated prior to the deactivating of one or more of resistive elements 12A–12F. Allowing the activation of resistive elements from both pluralities during transition between logic low and logic high signal transmissions may allow for a faster switching speed of I/O circuit 10.

Given the configuration in which the resistive elements are connected, the output impedance may be determined by the parallel combination of resistive elements when two or more are activated. Consequently, the resistive elements may be chosen such that activating a first resistive element places the output near the desired impedance, while the activation of additional resistive elements may fine tune the output impedance. In this manner, the control circuits 15A and 15B may carefully the control the output impedance of I/O circuit 10 in order to match the output impedance as closely as possible to the impedance of a signal line coupled to output node 20.

Figure 2:
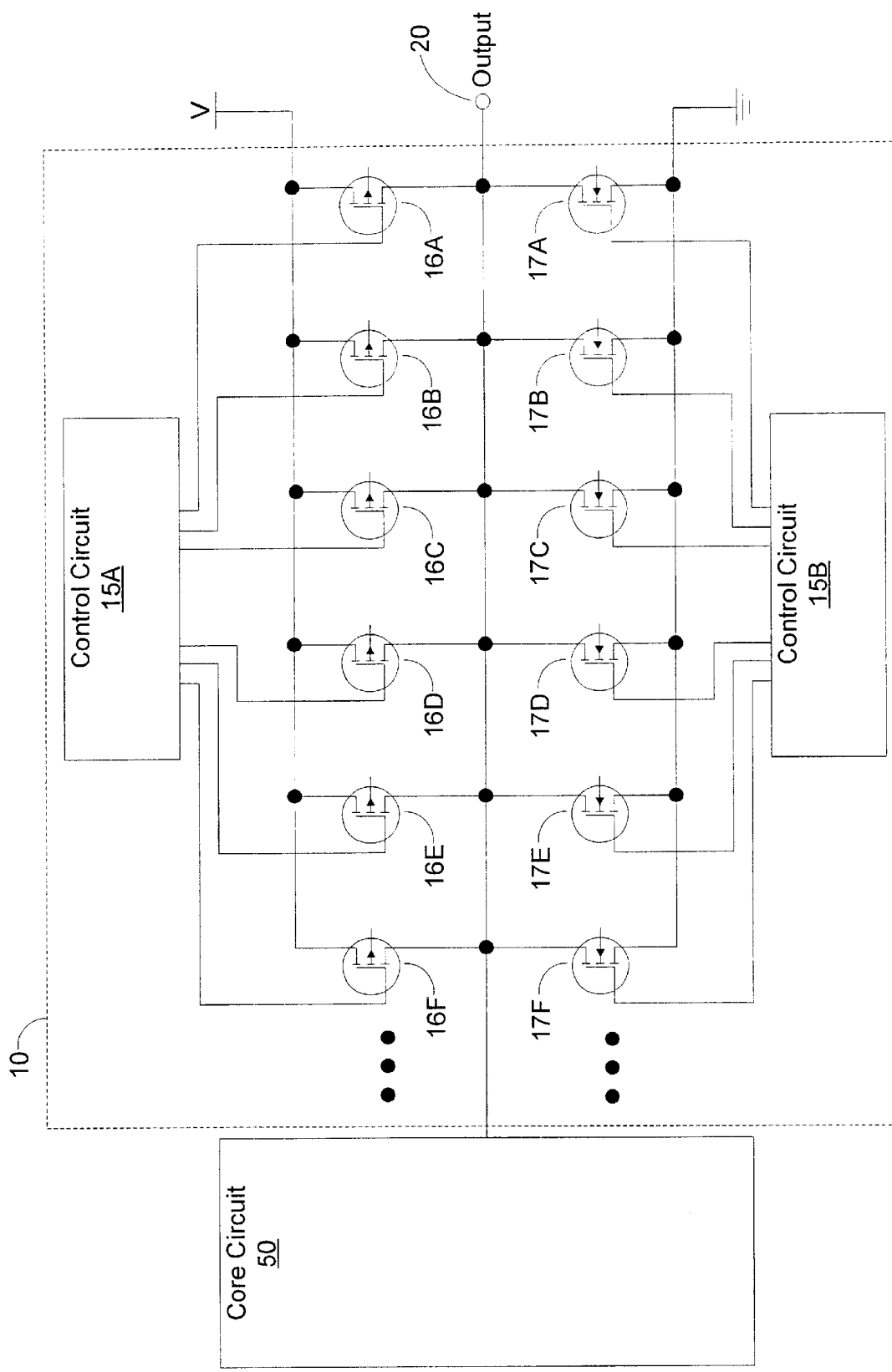
FIG. 2 is a schematic diagram of one embodiment of an I/O circuit where transistors are used as the resistive elements.

Moving now to FIG. 2, a schematic diagram of one embodiment of an I/O circuit where transistors are used as the resistive elements is shown. Transistors are used to provide the functions of both the switches and resistive elements of the embodiment shown in FIG. 1. I/O circuit 10, in this embodiment, includes a first plurality of transistors 16A–16F and a second plurality of transistors 17A–17F. In this particular example, the transistors are MOSFETs (metal oxide semiconductor field effect transistors). However, other embodiments of I/O circuit 10 are possible and contemplated wherein other types of transistors (e.g. bipolar) are used.

In the embodiment shown, each of the first plurality of transistors is a P-type MOSFET, while each of the second plurality of transistors is an N-type MOSFET. Alternate embodiments are possible and contemplated wherein the first plurality may utilize N-type transistors while the second plurality utilizes P-type transistors, depending on the operating voltages present. Furthermore, embodiments are also possible and contemplated wherein both the first and second pluralities of transistors are P-type or N-type transistors, also depending on the operating voltages present.

A switching function for each of the transistors in this embodiment may be provided by controlling a gate terminal. Control circuit 15A is coupled to the gate terminal of each of transistors 16A–16F, while control circuit 15B is coupled to the gate terminal of each of transistors 17A–17F. Each of transistors 16A–16F and 17A–17F may be activated by applying the necessary gate-source biasing voltage, $V_{GS}$. Similar to the embodiment discussed in FIG. 1, one or more of transistors 16A–16F may be activated during a logic high signal transmission, while one or more of transistors 17A–17F may be activated during a logic low transmission. Furthermore, during transitions between logic high and logic low transmissions, transistors from both pluralities may be momentarily activated, similar to the manner discussed above for the resistive elements.

The function of the resistive elements may be performed, in this embodiment, by the resistance existing between the drain and the source of each transistor. When a given transistor is activated by a control circuit, current may be allowed to flow between its source and drain terminals. A drain-source resistance, $R_{DS}$, may exist between the source and drain terminals of each transistor. When two or more transistors of either the first plurality or second plurality are activated, the combined resistance may be the parallel combination of their respective drain-source resistances.

It is important to note that the transistors shown in FIG. 2 are not drawn to scale. As with the resistive elements in FIG. 1, each transistor, when activated, may provide a substantially different amount of resistance than the other transistors in its respective plurality. For example, transistor 16A, when activated, may have a drain-source resistance that is substantially different than the drain-source resistance of transistors 16B–16F, the drain-source resistance of transistor 16B may be substantially different from that of transistors 16C–16F, and so on. The variation of the drain-source resistance may be accomplished by varying the physical size of the transistors. In one embodiment, the transistors may be chosen such that the drain-source resistance may be inversely proportional to the transistor's physical size. Thus, when activating multiple transistors to achieve the desired output impedance, the transistor which is physically largest of the plurality may be activated first, while the transistor that is physically smallest may be activated second. Each transistor activated subsequent to the second transistor may be slightly larger than the previous transistor activated, and thus may have a slightly smaller resistance. Since the drain-source resistances of the transistors are connected in parallel, the total resistance provided may be the parallel combination of all of the activated transistors within a given plurality.

As an example, assume that I/O circuit 10 is to perform a logic high signal transmission onto a signal line coupled to output node 20. In order to match the output impedance of I/O circuit 10 to the signal line coupled to output node 20, it may be required to activate one or more of transistors 16A–16F. For the purposes of this example, it is assumed that transistor 16A is physically the largest transistor of transistors 16A–16F; transistor 16B is assumed to be physically the smallest of this group, while each of transistors 16C–16F is successively larger than the previous transistor. Transistor 16A may be the first transistor to be activated, as it is physically the largest, and thus provides the smallest drain-source resistance. This resistance may put the output impedance of I/O circuit 20 into the approximate range of the desired output impedance. Transistor 16B may be the next transistor to be activated. Individually, the drain-source resistance of transistor 16B may be much larger than that of transistor 16A, as transistor 16B is physically much smaller. However, when the two transistors are connected in parallel, the amount of change of the total output impedance of may be relatively small. Transistor 16C may be the next transistor to be activated, and may be slightly larger than transistor 16B. Thus, individually it may provide slightly less drain-source resistance than transistor 16B, while the parallel combination of transistors 16A, 16B, and 16C may provide an output impedance that is only a small amount less than the parallel combination of only transistors 16A and 16B.

The physical sizing of each of the transistors may be selected such that the amount of change of the output impedance is substantially the same for each transistor activated subsequent to the first. For example, transistors 16B–16F may be sized such that for each successive transistor that is activated, the amount of change of the output impedance (ie. the 'step size') may change by approximately 5 ohms (other step sizes are possible and contemplated; the use of a 5-ohm step size here is for exemplary purposes only). Thus, transistor 16A may be sized in order that, when activated, its drain-source resistance places the output impedance of I/O circuit 10 relatively close to the desired output impedance, while each successive transistor 16B through 16F which is activated reduces the output impedance by only 5 ohms. Reducing the output impedance in steps of substantially equal size may allow for more accurate fine tuning of the output impedance may be possible than in embodiments where each transistor is of approximately the same physical size, and thus provides the same approximate resistance. Other embodiments are possible and contemplated wherein the step sizes are not necessarily equal, although the transistors may be varied in size in order to provide better granularity than may be available in the prior art.

While the terms "first", "next" and "successive" are used in this example, a particular temporal sequence for activating the transistors is not implied, and in fact, the transistors of a given plurality may all be activated at approximately the same time. The above example may also be applied to logic low transmissions, substituting transistors 17A–17F for transistors 16A–16F.

It should also be noted that the I/O circuits described in FIGS. 1 and 2 are described with respect to transmitting signals, these circuits may in fact be bi-directional. Thus, it may be possible that additional circuitry not shown here is present in order to provide for proper termination of signals intended to be received by core circuit 50. Other circuitry may include additional resistive elements, such as transistors, and their physical sizes (and/or resistances) may be varied in the same manner as described with respect to the circuits of FIGS. 1 and 2. Furthermore, embodiments are possible and contemplated wherein the circuitry disclosed herein for transmission of signals may also be used to control the input impedance for the purpose of receiving signals.

Turning now to FIG. 3, a table illustrating the effects of step size for activating successive transistors of varying physical size in order to obtain a desired output impedance is shown. FIG. 3 shows a table for an embodiment of I/O circuit 10 having a first plurality of 16 transistors and a second plurality of 16 transistors. The figures presented in the table may be applied to either the first or second plurality.

For the embodiment described, transistor 0 may be the physically largest, and therefore may have the smallest resistance value of the group, 92 ohms. Activating transistor 0 may set the output impedance of the I/O circuit close to a desired output impedance. Transistor 1 may physically be the smallest transistor, and thus may have the largest resistance of the group, 1722 ohms. However, when activated in combination with transistor 0, the total parallel impedance, and thus the output impedance of I/O circuit is:

$$Rtot = \frac{R0 \times R1}{R0 + R1},$$

where R0 is the resistance of transistor 0, R1 is the resistance of transistor 1, and Rtot is the total parallel resistance. Inserting the values shown into the table yields a total resistance of total resistance of approximately 87 ohms. This calculation may be repeated for each successive transistor to be activated, substituting the previously calculated total resistance for R0 and the resistance value for the next transistor as R1.

Examining the values present in the table, it can be seen that the transistor impedance values of each successive transistor starting with R1 decrease, although the resistance value of R0 is still less than that of R1. The resistance values of these transistors, and hence their physical size, may be chosen such that the step size for the total resistance is between approximately 4 and 5 ohms, as shown in the total parallel impedance column. Thus, by varying the physical size of the transistors used and therefore their impedance, the step size for the total output impedance can be held relatively constant for each additional transistor activated. This may allow for more accurate fine-tuning of the output impedance than may be performed in circuits wherein the transistor sizes, and hence the drain-source resistance, is substantially the same for each transistor in the circuit.

The values presented in the table of FIG. 3 are nominal values. Similar calculations may be performed for the best and worst case scenarios of the transistors. The drain-source resistance of the transistors may vary due to process, voltage, and temperature. Process refers to the manufacturing process of the integrated circuit in which the I/O circuit may be implemented. Voltage and temperature may refer to the voltage and temperature variations that may be encountered during normal operating conditions.

Figure 4:
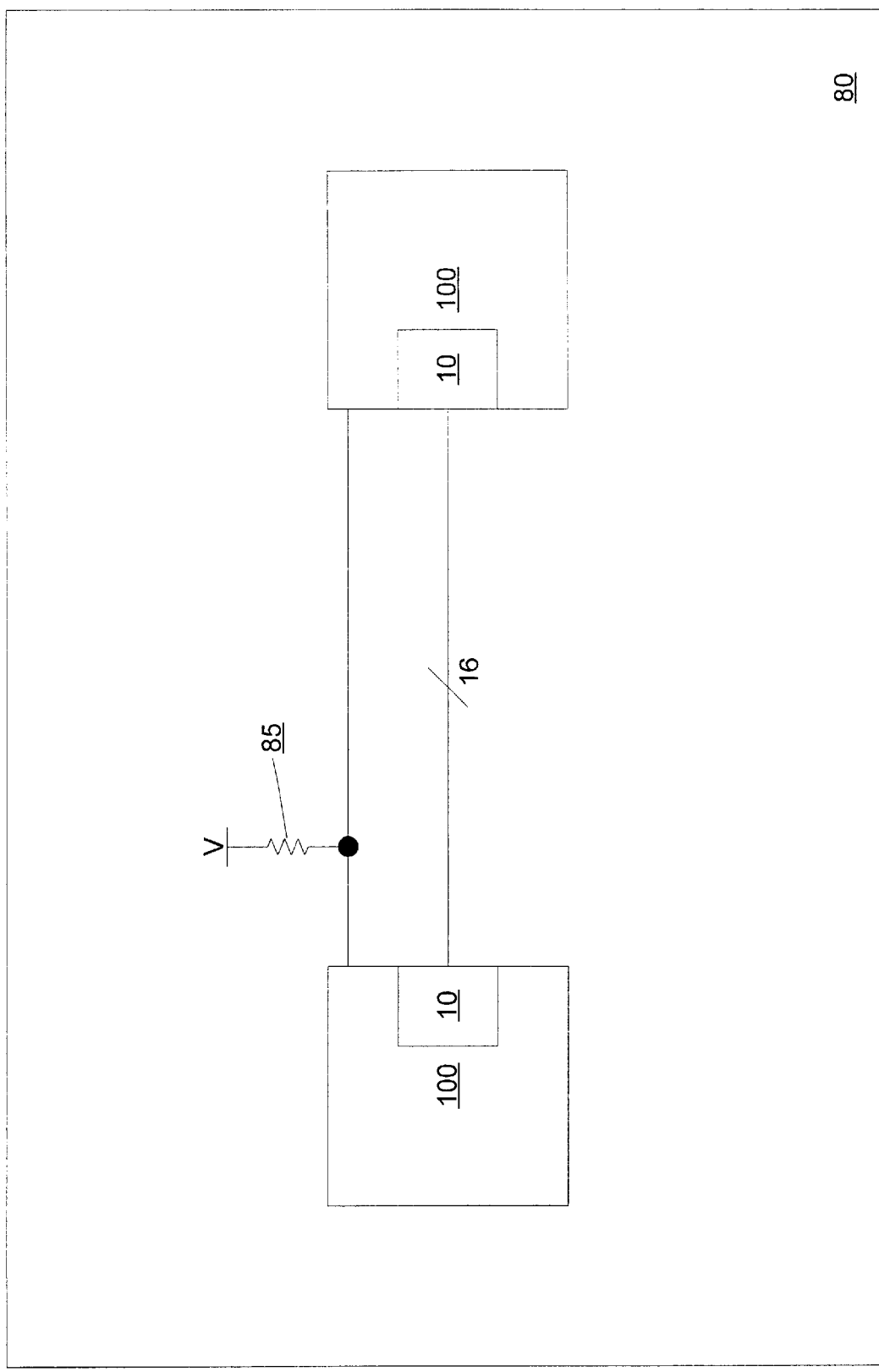
FIG. 4 is a block diagram illustrating an integrated circuit (IC) having an I/O circuit mounted on a printed circuit board.

Turning now to FIG. 4, a block diagram illustrating an integrated circuit (IC) having an I/O circuit mounted on a printed circuit board is shown. In the embodiment shown, printed two integrated circuits (ICs) 100, each having an I/O circuit 10, are mounted upon printed circuit board 80. The I/O circuits 10 for this embodiment may be expanded to accommodate signal lines of a bus. The ICs 100 may be coupled to each other by a bus having 16 signal lines. A $17^{th}$ signal line may also be coupled between ICs 100. The $17^{th}$ signal line may also be coupled to a resistor 85, which may be further coupled to a voltage node. Although not shown, another resistor may be coupled between the $17^{th}$ signal line and a reference (i.e. ground) node. Resistor 85 may be used as a calibration resistance for determining a number of transistors to be activated during a signal transmission.

Each I/O circuit 10 in ICs 100 may include control circuits such as those described above in reference to FIGS. 1 and 2. The control circuits may be configured to periodically calibrate the I/O circuit in order to determine the number of resistive elements (transistors) to be activated during a signal transmission. In one embodiment, calibration may be performed by periodically measuring the impedance present on the signal line. The measured impedance may be substantially the same as the impedance of the 16 signal lines of the bus coupling the two ICs 100. Using the measured impedance, the control circuit may determine the number of transistors that must be activated to match the impedance of each of the signal lines of the bus. Thus, during a transmission of signals onto the bus by one of ICs 100, I/O circuits 10 may activate one or more resistive elements/transistors for each signal line in order to perform impedance matching functions, as described above.

Other embodiments of I/O circuit 10 wherein the circuitry is not implemented on an integrated circuit, or implemented on an integrated circuit separate from integrated circuit 100 or core circuit 50 (of FIGS. 1 and 2) are also possible and contemplated.

As previously noted, the calibration may be performed on a periodic basis. Performing the calibration periodically may allow for the I/O circuits 10 to account for impedance variations that may result from temperature and voltage variations occurring during normal operations. In one embodiment, the calibration may be performed every 100 milliseconds, although other embodiments are possible and contemplated wherein the calibration is performed more often or less often.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. An input/output (I/O) circuit comprising:

a first plurality of resistive elements connected in parallel between a first reference node and an output node and a second plurality of resistive elements connected in parallel between the output node and a second reference node, wherein each of the first plurality of resistive elements and each of the second plurality of resistive elements includes a control terminal, and wherein the output node is coupled to a core circuit and a signal line; and a control circuit coupled to the control terminal of each of the-first plurality of resistive elements and each of the second plurality of resistive elements, wherein the control circuit is configured to activate one or more of the first plurality of resistive elements during a logic high transmission from the core circuit onto the signal line, and wherein the control circuit is configured to activate one or more of the second plurality of resistive elements during a logic low transmission from the core circuit onto the signal line;

wherein the first plurality includes first, second, and third resistive elements, wherein each of the first, second, and third resistive elements is of a substantially different resistance with respect to each other; and wherein the second plurality includes fourth, fifth, and sixth resistive elements, wherein each of the fourth, fifth, and sixth resistive elements is of a substantially different resistance with respect to each other.

2. The I/O circuit as recited in claim 1, wherein during a logic high transmission, the output impedance of the I/O circuit is substantially matched to an impedance of the signal line by activating one or more of the first plurality of resistive elements;

and wherein, during a logic low transmission, the output impedance is substantially matched to the impedance of the signal line by activating one or more of the second plurality of resistive elements.

3. The I/O circuit as recited in claim 1, wherein a resistive step size resulting from activating successive resistive elements in either the first plurality or the second plurality is substantially equal.

4. The I/O circuit as recited in claim 1, wherein each of the first plurality of resistive elements and each of the second plurality of resistive elements is a transistor.

5. The I/O circuit as recited in claim 4 wherein the transistor is a metal-oxide semiconductor field effect transistor (MOSFET).

6. The I/O circuit as recited in claim 5 wherein the control terminal of the transistor is a gate terminal.

7. The I/O circuit as recited in claim 5 wherein the transistor includes a drain terminal and a source terminal, and wherein a resistance exists between the drain terminal and the source terminal.

8. The I/O circuit as recited in claim 5 wherein each of the first plurality of resistive elements is a P-type MOSFET and each of the second plurality of resistive elements is an N-type MOSFET.

9. The I/O circuit as recited in claim 8 wherein each of the P-type MOSFETs is of a substantially different physical size with respect to other P-type MOSFETs in the first plurality of resistive elements, and wherein each of the N-type MOSFETs is of a substantially different physical size with respect to other N-type MOSFETs in the second plurality of resistive elements.

10. The I/O circuit as recited in claim 1, wherein the control circuit is configured to activate one or more of the first plurality of resistive elements during a logic high transmission by the I/O circuit, and activate one or more of the second plurality of resistive elements during a logic low transmission by the I/O circuit.

11. The I/O circuit as recited in claim 1, wherein the first reference node is a voltage node and the second reference node is a ground node.

12. The I/O circuit as recited in claim 1, wherein the I/O circuit is comprised within an integrated circuit (IC).

13. The I/O circuit as recited in claim 12 wherein the IC is configured for mounting on a printed circuit board (PCB), and wherein a calibration resistance is present on the PCB.

14. The I/O circuit as recited in claim 13 wherein the control circuit is configured to calibrate the I/O circuit based on the calibration resistance, wherein calibrating the I/O circuit comprises determining a number of resistive elements to be activated during a transmission by the I/O circuit.

15. A method for controlling output impedance from a I/O circuit, the method comprising:
providing a first plurality of resistive elements connected in parallel between a first reference node and an output node arid a second plurality of resistive elements connected in parallel between the second reference node and a reference node, wherein each of the first plurality of resistive elements and each of the second plurality of resistive elements includes a control terminal coupled to a control circuit, wherein the output node is coupled to a core circuit and a signal line;
activating one or more of the first plurality of resistive elements during a logic high transmission from the core circuit onto the signal line, wherein the first plurality includes first, second, and third resistive elements, wherein each of the first, second, and third resistive elements is of a substantially different resistance with respect to each other, wherein said activating one or more of the first plurality is performed by the control circuit; and
activating one or more of the second plurality of resistive elements during a logic low transmission from the core circuit onto the signal line, wherein the second plurality includes fourth, fifth, and sixth resistive elements, wherein each of the fourth, fifth, and sixth resistive elements is of a substantially different resistance with respect to each other, wherein said activating one or more of the second plurality is performed by the control circuit.

16. The method as recited in claim 15 further comprising substantially matching the impedance of the I/O circuit to the signal line by said activating one or more of the first plurality during a logic high transmission, and substantially matching the impedance of the I/O circuit to the signal line by said activating one or more of the second plurality during a logic low transmission.

17. The method as recited in claim 15, wherein a resistive step size resulting from activating successive resistive elements in either the first plurality or the second plurality is substantially equal.

18. The method as recited in claim 15, wherein each of the first plurality of resistive elements and each of the second plurality of resistive elements is a transistor.

19. The method as recited in claim 18, wherein the transistor is a metal-oxide semiconductor field effect transistor (MOSFET).

20. The method as recited in claim 19, wherein the control terminal of the transistor is a gate terminal.

21. The method as recited in claim 19, wherein the transistor includes a drain terminal and a source terminal, and wherein a resistance exists between the drain terminal and the source terminal.

22. The method as recited in claim 19, wherein each of the first plurality of resistive elements is a P-type MOSFET and each of the second plurality of resistive elements is an N-type MOSFET.

23. The method as recited in claim 22, wherein each of the P-type MOSFETs is of a substantially different physical size with respect to the other P-type MOSFETs in the first plurality of resistive elements, and wherein each of the N-type MOSFETs is of a substantially different size than with respect to the other N-type MOSFETs in the second plurality of resistive elements.

24. The method as recited in claim 15, wherein the control circuit is configured to activate one or more of the first plurality of resistive elements during a logic high transmission by the I/O circuit and activate one or more of the second plurality of resistive elements during a logic low transmission by the I/O circuit.

25. The method as recited in claim 15, wherein the first reference node is a voltage node second reference node is a ground node.

26. The method as recited in claim 15, further comprising the control circuit periodically calibrating the I/O circuit, wherein said calibrating the I/O circuit includes determining the number of resistive elements in the first plurality to be activated during a logic high transmission and determining the number of resistive elements in the second plurality to be activated during a logic low transmission.

27. An system comprising:
a core circuit; and
and I/O circuit configured to transmit signals originating in the core circuit, the I/O circuit comprising:
a first plurality of resistive elements connected in parallel between a first reference node and an output node and a second plurality of resistive elements connected in parallel between the output node and a second reference node, wherein each of the first plurality of resistive elements and each of the second plurality of resistive elements includes a control terminal, and wherein the output node is coupled to a core circuit and a signal line; and a control circuit coupled to the control terminal of each of the first plurality of resistive elements and each of the second plurality of resistive elements, wherein the control circuit is configured to activate one or more of the first plurality of resistive elements during a logic high transmission from the core circuit onto the signal line, and wherein the control circuit is configured to activate one or more of the second plurality of resistive elements during a logic low transmission from the core circuit onto the signal line;

wherein the first plurality includes first, second, and third resistive elements, wherein each of the first, second, and third resistive elements is of a substantially different resistance with respect to each other; and wherein the second plurality includes fourth, fifth, and sixth resistive elements, wherein each of the fourth, fifth, and sixth resistive elements is of a substantially different resistance with respect to each other.

28. The system as recited in claim 27, wherein during a logic high transmission, the output impedance of the I/O circuit is substantially matched to an impedance of the signal line by activating one or more of the first plurality of resistive elements;

and wherein, during a logic low transmission, the output impedance is substantially matched to the impedance of the signal line by activating one or more of the second plurality of resistive elements.

29. The system as recited in claim 27, wherein a resistive step size resulting from activating successive resistive elements in either the first plurality or the second plurality is substantially equal.

30. The system as recited in claim 27, wherein each of the first plurality of resistive elements and each of the second plurality of resistive elements is a transistor.

31. The system as recited in claim 30, wherein the transistor is a metal-oxide semiconductor field effect transistor (MOSFET).

32. The system as recited in claim 31, wherein the control terminal of the transistor is a gate terminal.

33. The system as recited in claim 31, wherein the transistor includes a drain terminal and a source terminal, and wherein a resistance exists between the drain terminal and the source terminal.

34. The system as recited in claim 31, wherein each of the first plurality of resistive elements is a P-type MOSFET and each of the second plurality of resistive elements is an N-type MOSFET.

35. The system as recited in claim 34 as recited in claim wherein each of the P-type MOSFETs is of a substantially different physical size with respect to other P-type MOS-FETs in the first plurality of resistive elements, and wherein each of the N-type MOSFETs is of a substantially different physical size with respect to other N-type MOSFETs in the second plurality of resistive elements.

36. The system as recited in claim 27, wherein the control circuit is configured to activate one or more of the first plurality of resistive elements during a logic high transmission by the I/O circuit, and activate one or more of the second plurality of resistive elements during a logic low transmission by the I/O circuit.

37. The system as recited in claim 27, wherein the first reference node is a voltage node and the second reference node is a ground node.

38. The system as recited in claim 27, wherein the system is comprised within an integrated circuit, wherein the integrated circuit is configured for mounting on a printed circuit board (PCB), and wherein a calibration resistance is present on the PCB.

39. The system as recited in claim 38, wherein the control circuit is configured to calibrate the I/O circuit based on the calibration resistance, wherein calibrating the I/O circuit comprises determining a number of resistive elements to be activated during a transmission by the I/O circuit.

40. An input/output (I/O) circuit comprising:

a first plurality of transistors and a second plurality of transistors, wherein each of the first plurality of transistors is in parallel between a first reference node and an output node, and wherein each of the second plurality of transistors is connected in parallel between the output node and a second reference node, wherein the output node is configured to convey a logic transmission received from a core circuit;

a control circuit coupled to a control terminal of each of the first plurality of transistors and each of the second plurality of transistors, wherein the control circuit is configured to activate one or more of the first plurality of transistors during a logic high transmission received from the core circuit and one or more of the second plurality of transistors during a logic low transmission received from the core circuit;

wherein each of the first plurality of transistors and has a substantially different drain-source resistance with respect to other transistors of the first plurality; and wherein each of the second plurality of transistors has a substantially different drain-source resistance with respect to other transistors of the second plurality.

41. The I/O circuit as recited in claim 40, wherein each of the first plurality of transistors is of a substantially different physical size with respect to other ones of the first plurality of transistors.

42. The I/O circuit as recited in claim 40, wherein each of the second plurality of transistors is of a substantially different physical size with respect to other ones of the second plurality of transistors.

* * * * *

UNITED STATES PATENT AND TRADEMARK OFFICE
CERTIFICATE OF CORRECTION

PATENT NO.    : 6,642,742 B1
DATED         : November 4, 2003
INVENTOR(S)   : Bruce A. Loyer It is certified that error appears in the above-identified patent and that said Letters Patent is hereby corrected as shown below:

<u>Column 12,</u>
Line 42, please delete "and".

Signed and Sealed this

Thirtieth Day of March, 2004

JON W. DUDAS
*Acting Director of the United States Patent and Trademark Office*